United States Patent
Yin et al.

(10) Patent No.: US 8,723,539 B2
(45) Date of Patent: May 13, 2014

(54) TEST CARD FOR MOTHERBOARDS

(75) Inventors: Xiao-Gang Yin, Shenzhen (CN); Wan-Hong Zhang, Shenzhen (CN); Zhao-Jie Cao, Shenzhen (CN); Guo-Yi Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 147 days.

(21) Appl. No.: 13/282,664

(22) Filed: Oct. 27, 2011

(65) Prior Publication Data

US 2013/0069681 A1 Mar. 21, 2013

(30) Foreign Application Priority Data

Sep. 21, 2011 (CN) .......................... 2011 1 0281684

(51) Int. Cl.
 *G01R 31/20* (2006.01)
(52) U.S. Cl.
 USPC ............ 324/754.07; 324/763.01; 324/757.02; 324/762.02; 324/756.07; 324/555; 714/724; 714/734; 714/733; 714/742
(58) Field of Classification Search
 USPC ............ 324/754.07, 763.01, 757.02, 754.08, 324/227, 750.15, 750.16, 762.01, 762.02, 324/555, 756.01, 756.07; 714/724, 734, 714/733, 742; 371/22.1, 22.6
 See application file for complete search history.

(56) References Cited

U.S. PATENT DOCUMENTS

| | | | |
|---|---|---|---|
| 4,922,191 A * | 5/1990 | Conover | 324/750.19 |
| 6,447,339 B1 * | 9/2002 | Reed et al. | 439/638 |
| 6,867,578 B1 * | 3/2005 | Miller | 324/756.07 |
| 7,285,970 B2 * | 10/2007 | Robinson | 324/756.02 |
| 8,310,256 B2 * | 11/2012 | Suto | 324/754.21 |
| 8,531,202 B2 * | 9/2013 | Mok et al. | 324/762.03 |
| 2004/0102917 A1 * | 5/2004 | Chen et al. | 702/120 |
| 2007/0096755 A1 * | 5/2007 | Parrish et al. | 324/754 |
| 2008/0024159 A1 * | 1/2008 | Tilbor et al. | 324/99 R |
| 2008/0155292 A1 * | 6/2008 | Ren | 713/330 |
| 2008/0191707 A1 * | 8/2008 | Collins et al. | 324/537 |
| 2009/0322346 A1 * | 12/2009 | Cao | 324/555 |
| 2010/0264731 A1 * | 10/2010 | Arimilli et al. | 307/24 |
| 2011/0087942 A1 * | 4/2011 | Conner | 714/738 |

* cited by examiner

*Primary Examiner* — Tung X Nguyen
*Assistant Examiner* — Thang Le
(74) *Attorney, Agent, or Firm* — Novak Druce Connolly Bove + Quigg LLP

(57) ABSTRACT

A test card includes a power interface, a controller, a test interface, and a test point. The test interface includes a power pin, a start pin, and a data signal pin. The power interface is connected to the controller and the power pin, and also connected to an external power to receive a work voltage. The controller transmits a turn-on signal to the start pin. The test point is connected to the data signal pin. When an interface of a motherboard is connected to the test interface, the power pin, the start pin, and the data signal pin are connected to corresponding pins of the interface of the motherboard. The motherboard outputs a data signal to the test point through the motherboard interface and the test interface after the controller receives the turn-on signal.

4 Claims, 3 Drawing Sheets

TEST CARD FOR MOTHERBOARDS

TECHNICAL FIELD

The present disclosure relates to test cards, in particular to a test card for motherboards.

DESCRIPTION OF RELATED ART

Many high density module (HDM) connectors are mounted on a backplane of a blade server to connect a plurality of motherboards. This is inconvenient when the motherboard needs to be tested. To connect cables, to test the motherboard a probe needs to directly contact the test points on the motherboard. Therefore, it is inconvenient to test the motherboard.

BRIEF DESCRIPTION OF THE DRAWINGS

Many aspects of the present embodiments can be better understood with reference to the following drawings. The components in the drawing are not necessarily drawn to scale, the emphasis instead being placed upon clearly illustrating the principles of the present disclosure. Moreover, in the drawings, all the views are schematic, and like reference numerals designate corresponding parts throughout the several views.

DETAILED DESCRIPTION

The disclosure, including the accompanying drawings in which like references indicate similar elements, is illustrated by way of example and not by way of limitation. It should be noted that references to "an" or "one" embodiment in this disclosure are not necessarily to the same embodiment, and such references mean at least one.

Figure 1:
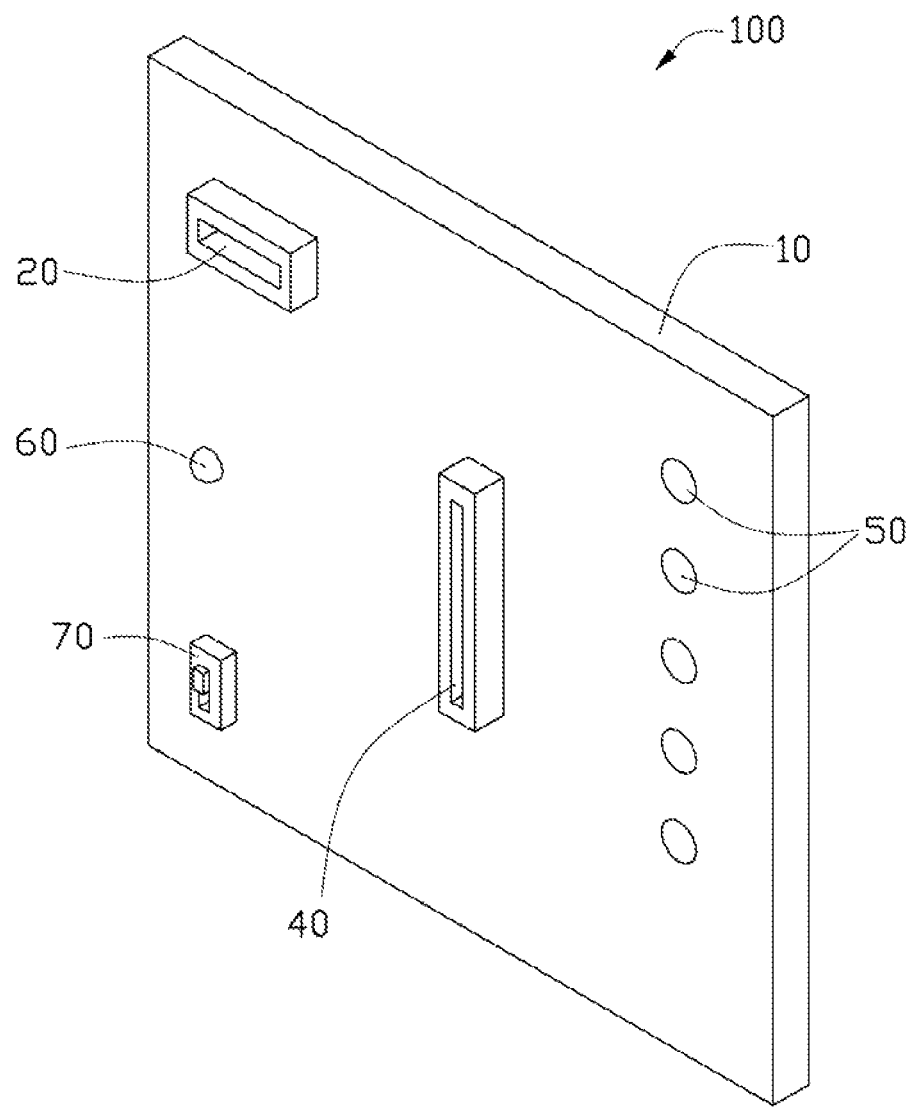
FIG. 1 is a schematic view of an exemplary embodiment of a test card.
Figure 2:
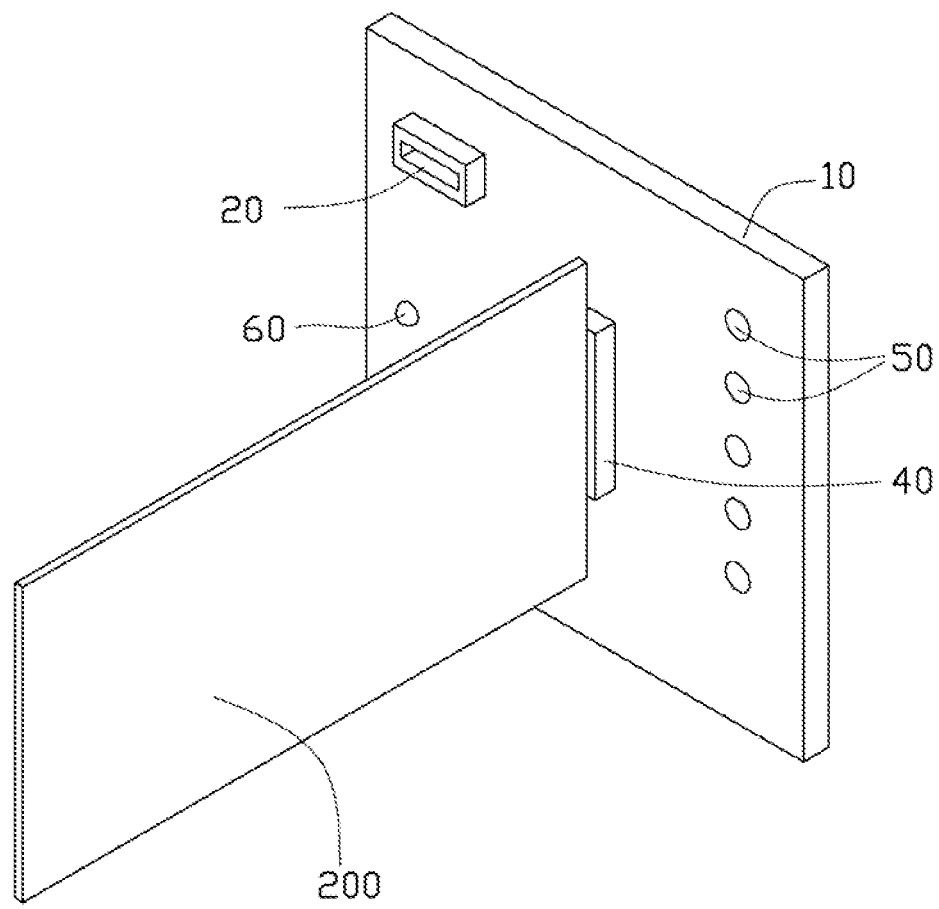
FIG. 2 is a schematic view of the test card of FIG. 1 testing a motherboard.
Figure 3:
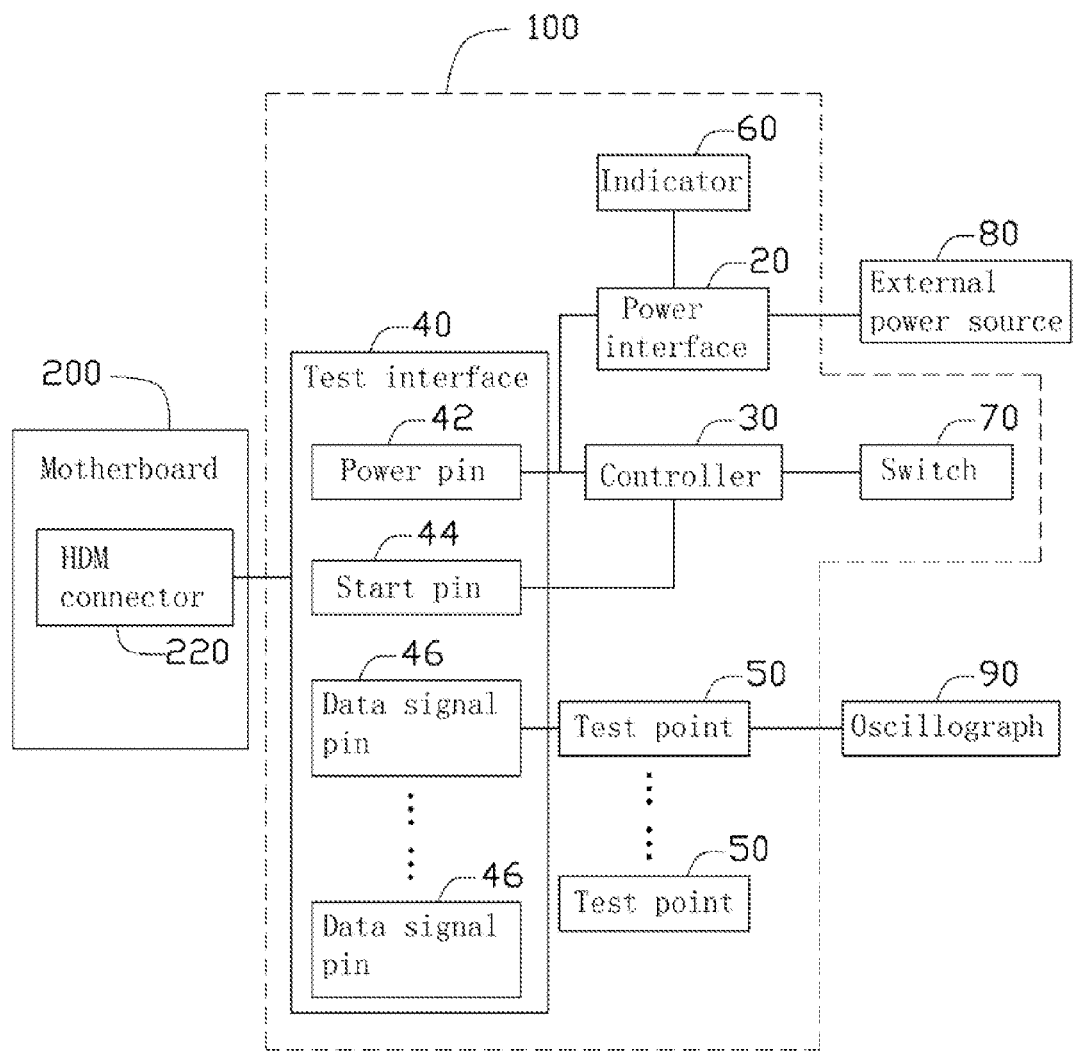
FIG. 3 is a block diagram of the test card and the motherboard of FIG. 2.

Referring to FIGS. 1-3, an embodiment of a test card 100 is used to test output signals of a motherboard 200 of a server. The test card 100 includes an enclosure 10, a power interface 20, a controller 30, a test interface 40, a group of test points 50, an indicator 60, and a switch 70. The power interface 20, the test interface 40, the test points 50, the indicator 60, and the switch 70 are all mounted on and are exposed from the enclosure 10. The controller 30 is mounted in the enclosure 10. In the embodiment, the test interface 40 is a high density module (HDM) interface. The indicator 60 is a light emitting diode.

The test interface 40 includes a power pin 42, a start pin 44, and a plurality of data signal pins 46.

The power interface 20 is used to connect an external power source 80 to receive a work voltage. The power interface 20 is connected to the controller 30, the indicator 60, and the power pin 42, to power the controller 30, the indicator 60, and the power pin 42.

The indicator 60 is used to indicate whether the controller 30 is powered on. When the indicator 60 receives the work voltage, the indicator 60 emits light, which denote that the controller 30 is receiving power, then the controller 30 can be turned on. When the indicator 60 fails to receive the work voltage, the indicator 60 will not emit light, which denotes that the controller 30 is not receiving power, then the controller 30 cannot be turned on.

The switch 70 is connected to the controller, to turn on the controller 30.

The controller 30 is connected to the power pin 42 and the start pin 44, to transmit a start signal from the switch 70 to the start pin 44.

The data signal pins 46 are connected to the corresponding test points 50.

In test, an HDM connector 220 of the motherboard 200 is connected to the test interface 40. The power pin 42, the start pin 44, and the data signal pins 46 are connected to corresponding pins of the HDM connector 220. The power interface 20 is connected to the external power source 80, to receive the work voltage, and output the work voltage to the controller 30 and the indicator 60. The power interface 20 also outputs the work voltage to the motherboard 200 through the test interface 40 and the HDM connector 220. The indicator 60 emits light which indicates that the controller 30 can be turned on. The switch 70 is pressed to generate a turn-on signal. The controller 30 transmits the turn-on signal to the motherboard 200 through the test interface 40 and the HDM connector 220, to power on the motherboard 200. The motherboard 200 operates to start an operating system, and outputs data signals to the corresponding points 50 through the HDM connector 220 and the test interface 40. An oscillograph 90 is connected to the corresponding test points 50 to test the corresponding data signals outputted by the motherboard 200.

In other embodiments, the indicator 60 can be omitted. The switch 70 can be omitted, that is, when the controller 30 is powered on, the controller 30 transmits the start signal to the motherboard 200. The test points 50 can only include one test point.

Although numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the embodiments to the full extent indicated by the broad general meaning of the terms in which the appended claims are expressed.

What is claimed is:

1. A test card to test output signals of a motherboard, the test card comprising:
   a power interface connected to an external power to receive a work voltage from the external power;
   a test interface connected to an interface of the motherboard, the test interface comprising a power pin connected to the power interface to receive the work voltage, a start pin, and at least one data signal pin;
   a controller connected to the power interface to receive the work voltage, and connected to the test interface to transmit a turn-on signal to the start pin of the test interface; and
   at least one test point connected to and corresponding to at least one data signal pin.
   wherein the controller is mounted in an enclosure, the power interface, the test interface, and the at least one test point are mounted on and exposed through the enclosure.

2. The test card of claim 1, further comprising an indicator, wherein the indicator is used to indicate whether the controller is receiving power, the indicator is connected to the power interface to receive the work voltage to emit light.

3. The test card of claim 1, further comprising a switch, wherein the switch is connected to the controller to output the turn-on signal in response to being switched on.

4. The test card of claim 1, wherein the test interface is a high density module interface.

\* \* \* \* \*